United States Patent [19]

Iwasaki et al.

[11] Patent Number: 5,298,366
[45] Date of Patent: Mar. 29, 1994

[54] METHOD FOR PRODUCING A MICROLENS ARRAY

[75] Inventors: Takeo Iwasaki, Nagoya; Hideo Maruyama, Kuwana; Kouji Inaishi, Okazaki; Chisato Yoshimura, Nagoya; Yuji Shinkai, Kounan, all of Japan

[73] Assignee: Brother Kogyo Kabushiki Kaisha, Nagoya, Japan

[21] Appl. No.: 10,764

[22] Filed: Jan. 29, 1993

Related U.S. Application Data

[60] Division of Ser. No. 811,965, Dec. 23, 1991, Pat. No. 5,230,990, which is a continuation-in-part of Ser. No. 773,542, Oct. 9, 1991, abandoned.

[30] Foreign Application Priority Data

Oct. 9, 1990 [JP] Japan .................... 2-271657
Oct. 22, 1990 [JP] Japan .................... 2-283703

[51] Int. Cl.$^5$ .................... G03F 7/40; B29D 11/00
[52] U.S. Cl. .................... 430/321; 430/320; 430/330; 359/619; 359/620; 359/642; 359/900; 264/2.5
[58] Field of Search .............. 430/320, 321, 330, 946; 205/70, 79; 359/619, 620, 642, 900; 264/2.5

[56] References Cited

U.S. PATENT DOCUMENTS

| | | | |
|---|---|---|---|
| 4,737,447 | 4/1988 | Suzuki et al. | 430/321 |
| 4,966,831 | 10/1990 | Mehra et al. | 430/321 |
| 5,079,130 | 1/1992 | Derkits, Jr. | 430/321 |
| 5,225,935 | 7/1993 | Watanabe et al. | 359/619 |

FOREIGN PATENT DOCUMENTS

| | | | |
|---|---|---|---|
| 1-167802 | 7/1989 | Japan | 359/642 |
| 2-006123 | 1/1990 | Japan | |
| 2-282702 | 11/1990 | Japan | 359/619 |
| 3-198003 | 8/1991 | Japan | |
| 4-123004 | 4/1992 | Japan | 359/619 |

Primary Examiner—Charles L. Bowers, Jr.
Assistant Examiner—John A. McPherson
Attorney, Agent, or Firm—Oliff & Berridge

[57] ABSTRACT

The invention relates to an optical microlens array producing method. The microlens array producing method according to the invention uses an intermediate material forming process for forming an intermediate material of photoresist on a flat sheet, the intermediate material having projections formed in the shape of a predetermined pattern; a resist master forming process of forming a resist master by heating the intermediate material to thereby smooth the surfaces of the projections; an inverted mold forming process for forming an inverted mold having a surface shape that is the inverse of the resist master; a clad portion forming process, for forming a clad portion having grooves equal in sectional shape to the inverted mold, using the inverted mold and also using a first light-transmitting material of a low refractive index; a process for forming microlenses by filling concave portion of the clad portion with a second light-transmitting material which is higher in refractive index than the first light-transmitting material microlens with index than the first or the second light-transmitting.

9 Claims, 9 Drawing Sheets

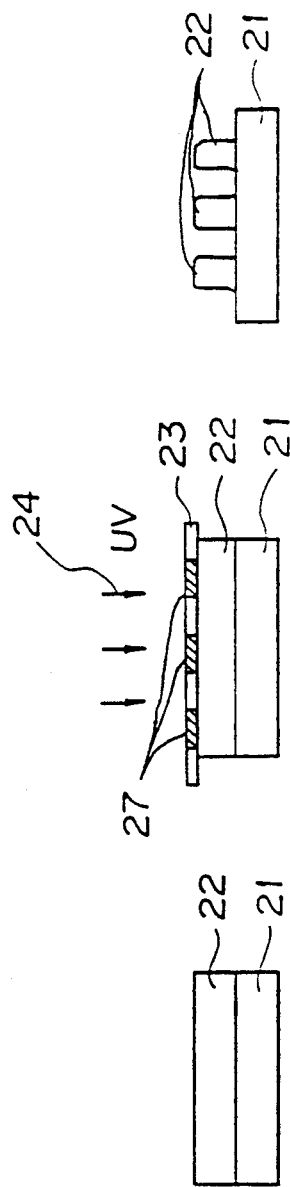
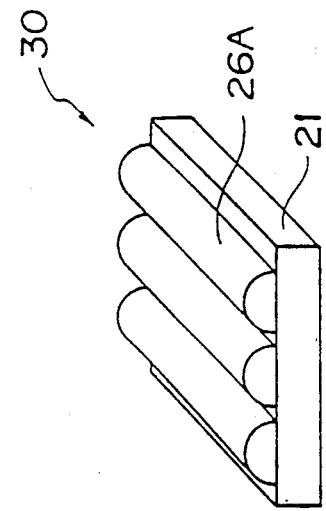
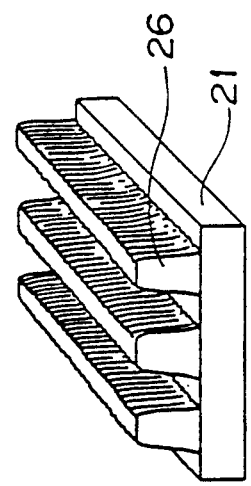
Fig.1A  Fig.1B  Fig.1C  Fig.1D  Fig.1E

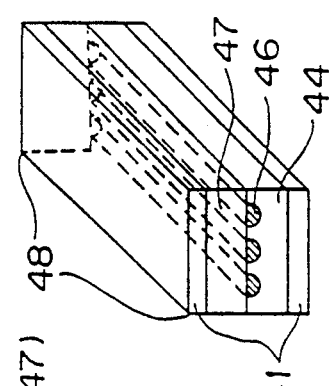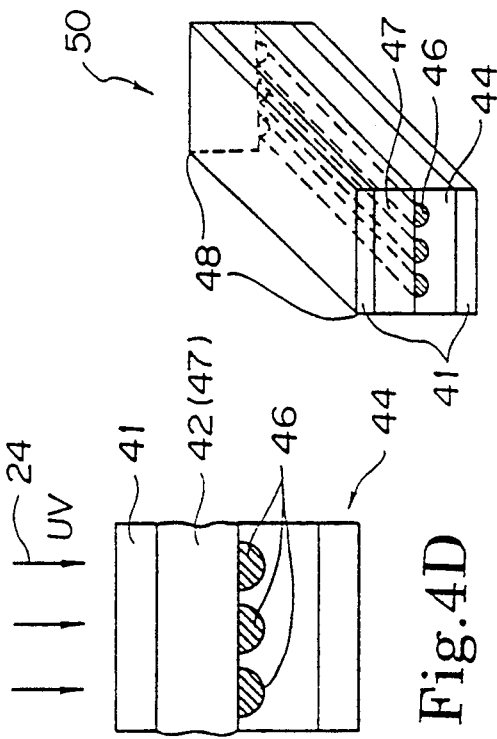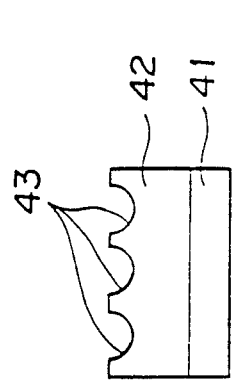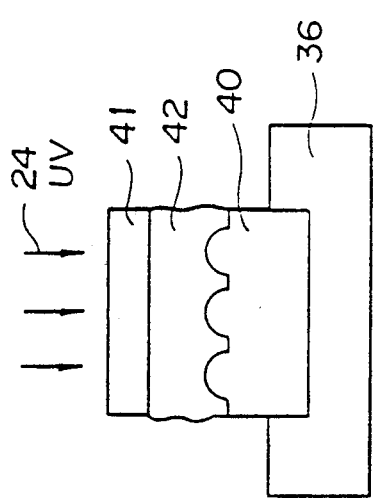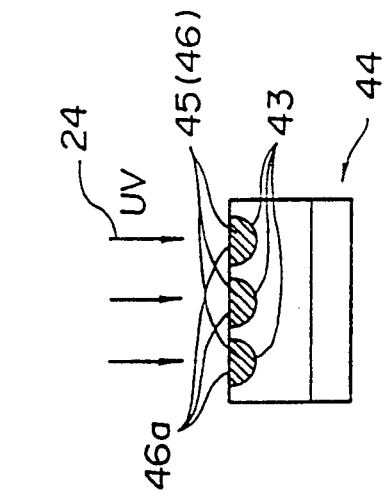

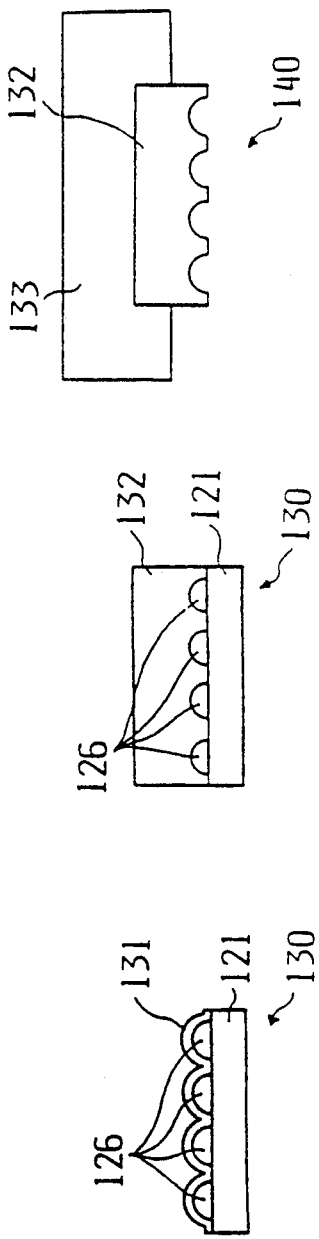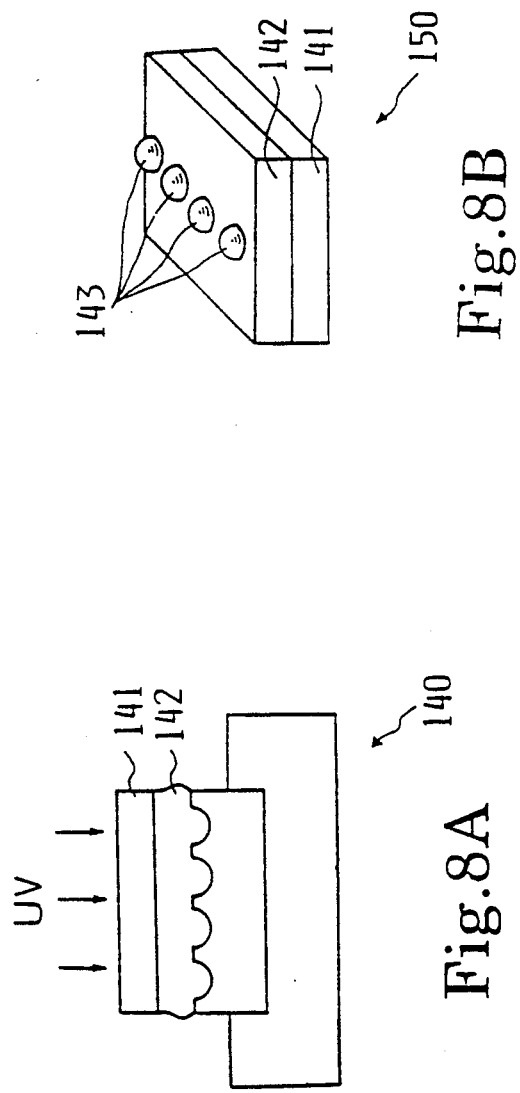

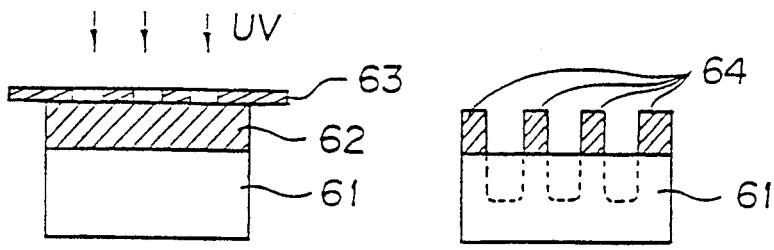
Fig.10A
RELATED ART
Fig.10B
RELATED ART
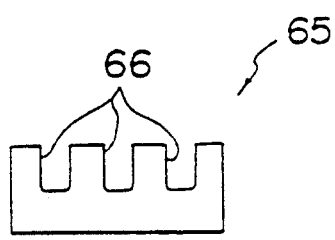
Fig.10C
RELATED ART
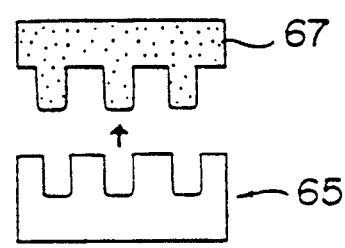
Fig.10D
RELATED ART
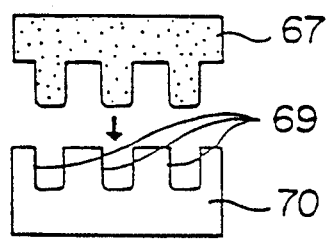
Fig.10 E
RELATED ART
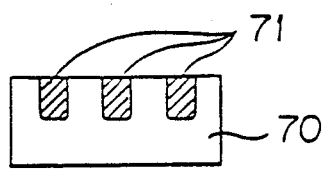
Fig.10 F
RELATED ART
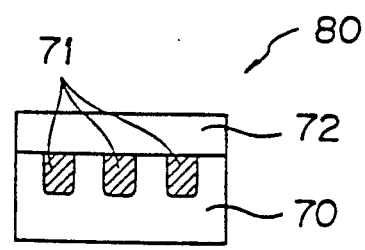
Fig.10G
RELATED ART

METHOD FOR PRODUCING A MICROLENS ARRAY

This is a division of application Ser. No. 07/811,965 filed Dec. 23, 1991, which in turn is a continuation-in-part of application Ser. No. 07/773,542, filed Oct. 9, 1991, now abandoned.

BACKGROUND OF THE INVENTION

1. Field of the Invention

The invention relates to an optical waveguide array for the optical transmission of a signal or energy.

2. Description of the Related Art

Heretofore, one method for producing optical waveguide arrays has used photolithography as described below.

FIGS. 9A-9D illustrate a selective polymerization method as a first example, the method is disclosed in Japanese Patent Laid Open No. 3-143069.

According to this selective polymerization method, a solution of an acryl monomer 52 dispersed in a polycarbonate 51 having a refractive index of 1.59 is cast into a film 55 (FIG. 9A).

Next, a transparent photomask 54 having light shielding portions of optical waveguide patterns is laminated onto the film 55 in close contact therewith. Then, ultraviolet light is radiated onto the film 55 from above and through the photomask 54. As a result, the acryl monomer 52 in each ultraviolet-radiated portion of the film 55 polymerizes with the polycarbonate 51 to form a copolymer 56 in the ultraviolet-radiated portion (FIG. 9B).

The film 55 with the copolymer 56 formed therein selectively is then heated in a vacuum, whereby unreacted acryl monomer 52 is removed from the portions of the film 55 that have not been radiated with the ultraviolet light. Each portion from which the acryl monomer 52 has been removed leaves a polycarbonate portion 57 (refractive index 1.59) behind. As a result, portions with the copolymer 56 formed therein become lower in refractive index (refractive index 1.575) than the polycarbonate portions 57. Therefore, when an optical waveguide array is later completed, the polycarbonate portions 57 formed in the shape of the optical waveguide patterns serve as core portions, while the portions with the copolymer 56 formed therein become a part of a clad portion (FIG. 9C).

Lastly, the film 55 is sandwiched in between low refractive index materials 58 having a refractive index lower than 1.59 to obtain a filmy, plastic, optical waveguide array 60 (FIG. 9D). The low refractive index materials 58 also constitute a part of the clad, portion of the optical waveguide array 60, like the copolymer 56 formed portions. The clad portion consists of the low refractive index materials 58 and the copolymer 56 formed portions, whereby the polycarbonate portions 57, the core portions, are covered completely.

A molding method that provides a second example is illustrated in FIGS. 10A to 10G. Examples of this molding method are disclosed in Japanese Patent Laid Open Nos. 55-120004 and 61-138903.

According to this molding method, first the upper surface of a glass or a metallic flat sheet 61 is coated with a photoresist 62 to form a thin layer onto which is then laminated, in close contact therewith, a photomask 63 having openings defining optical waveguide patterns. Ultraviolet light is selectively radiated onto the layer of the photoresist 62 from above and through the photomask 63.

Next, the photomask 63 is removed and then the photoresist 62 is removed from each of the ultraviolet-radiated portions using a developer. As a result, at each portion not radiated with the ultraviolet light, the photoresist 62 remains on the flat sheet 61 as a projection 64 of a pattern that is a reverse to the waveguide pattern of each opening of the photomask 63 (FIG. 10B).

Then, the flat sheet 61 is exposed to a solvent capable of dissolving the flat sheet 61 in accordance with a chemical etching method. At this time, the solvent does not come into contact with the portions of the flat sheet 61 where there remain the projections 64 of the photoresist 62 so that those portions of the flat sheet 61 are not dissolved. Thereafter, the projections 64 are removed, whereby grooves 66 are formed in the flat sheet 61 correspondingly to the openings of the optical waveguide patterns formed in the photomask 63. The flat sheet 61 having the thus-formed grooves 66 serves as a master 65 or an optical waveguide array (FIG. 10C).

Next, using the master 65, there is, formed a clad base 70 of a light transmitting plastic material. The method for forming the clad base 70 from the master 65 could be a casting method or an injection molding method. In this case, an electroconductive nickel film is formed on the groove-side surface of the master 65 by a sputtering method and a thick nickel layer is formed by a nickel electroforming method. Then, a light-transmitting plastic material of a low refractive index is poured into the master 65, and by separating the master 65 from the thus cast light-transmitting plastic material there is formed a stamper 67 having projections correspondingly to the openings of the optical waveguide patterns (FIG. 10D).

Then, using the stamper 67, there is formed a clad base 70 provided with grooves 69 having optical waveguide patterns in accordance with a known method such as, for example, a casting method or an injection molding method. A light-transmitting plastic material having a certain refractive index is used as the material of the clad base 70 (FIG. 10E).

Next, a light-transmitting plastic material is allowed to flow into the grooves 69 of the clad base 70 from one end of the grooves by using capillary action. This light-transmitting plastic material has a refractive index higher than that of the light-transmitting plastic material used to form the clad base 70. After the grooves 69 have been sufficiently filled with the resin, the resin is cured by the radiation of ultraviolet light, whereby cores 71 are formed in the grooves 69 (FIG. 10F).

Lastly, the whole surface on the side where the cores 71 have been formed is coated uniformly with a light-transmitting plastic material having a refractive index lower than that of the cores 71 to form a clad layer 72. In this way there is obtained an optical waveguide array 80 (FIG. 10G). In this case, a clad is formed by both the base 70 and the clad layer 72 to cover the cores 71 completely.

However, according to the selective polymerization method described as the first example above,, it is difficult to enlarge the difference in the refractive index between the copolymer portions 57 and the polycarbonate portions 58. Because the core-clad difference in refractive index cannot be made large leads to the problem that the optical waveguide opening angle of the optical waveguide array 60 formed by those materials also cannot be large. The "opening angle" indicates a spread angle at the points where light is emitted from the exit end of each optical waveguide, namely, an angle $\theta C (=\sin-1 (NA))$ determined by the number of openings, NA, of the optical waveguide (FIG. 5). That the opening angle cannot be made large means that it is impossible to construct an optical waveguide in a curved form having a small radius of curvature. It also means that, since the receiving angle for the light beam incident on each optical waveguide is small that the transmittable light quantity of the light beam coupled to the optical waveguide is small. Although how to calculate the percent opening is omitted, the opening angle of each optical waveguide of the optical waveguide array 60 formed in the first example is as small as 12.6°. The transmission loss of each optical waveguide formed by this method was 0.2 dB/cm.

According to the second method, the molding method, the optical waveguide array 80 can have a large opening angle because it is possible to freely select the material of the clad base 70 and that of the clad layer 72. For example, as the material of the cores 71 there is used an acrylic resin (trade name: Aronix M210, where the refractive index is 1.54, manufactured by Toa Gosei Chemical Industry Co., Ltd.) which is a photocurable resin, and as the material of the clad base 70 and clad layer 72 there is used an acrylic resin (trade name: Aronix M310, refractive index=1.46, a product of Toa Gosei Chemical Industry Co., Ltd.) which is also a photocurable resin. The opening angle of each optical waveguide in the resulting optical waveguide array 80 is 26.5°, which is larger than that in the optical waveguide array of the first example. However, the surface roughness of the inner walls of the grooves of the optical waveguides formed by the etching process is very conspicuous. Consequently, the optical waveguides of the optical waveguide array 80 formed in the second example each have a very large transmission loss and so can transmit a limited amount of light. In general, it is necessary that the surface roughness of an optical system, including optical waveguides and lenses, be kept to a value on the order of 0.01 μm or less.

SUMMARY OF THE INVENTION

The invention is directed to solving the above-mentioned problems. It is an object of the invention to provide an optical microlens array having a large opening angle and a small transmission loss, as well as a method for manufacturing such an optical microlens arrays.

In order to achieve the above object, the manufacturing method for an optical microlens array according to the invention, comprises the steps of:

forming an intermediate material of photoresist on a flat sheet, the intermediate material comprising at least one projection formed in the shape of a predetermined pattern;

forming a resist master by heating the intermediate material and thereby smoothing the surfaces of the projections;

forming an inverted mold having an inverted surface shape of the resist master;

forming a stamper by using the inverted mold, the stamper having a same surface shape as the resist master;

forming a first clad portion having at least one concave portion equal in sectional shape to the inverted mold using the inverted mold and also using a first light-transmitting material of a predetermined refractive index;

forming a microlens by filling the concave portion of the first clad portion with a second light-transmitting material which has a refractive index higher than that of the first light-transmitting material; and forming a second clad portion on the core-side surface of the first clad portion with the first light-transmitting material or a third light-transmitting material which has a refractive index lower than that of the second light-transmitting material.

According to the optical microlens producing method according to the invention, as is apparent from the above detailed description, there can be obtained optical microlens having a higher resolving power and a smaller transmission loss than those formed by a photoetching method.

BRIEF DESCRIPTION OF THE DRAWINGS

A preferred embodiment of the invention will be described in detail with reference to the following figures wherein:

FIGS. 1A to 1E illustrate the successive steps for forming a resist master;

FIGS. 4A to 4E illustrate a step by step casting method of an optical waveguide array forming process;

FIGS. 7A to 7C illustrate a step by step process using a microlens array forming method for the formation of a stamper after the formation of the resist master;

FIGS. 8A and 8B illustrate a step by step process for forming a microlens array casting using the microlens array forming method;

FIGS. 10A to 10G illustrate a step by step process for a molding method which is a second one of the related art optical waveguide array forming methods.

DETAILED DESCRIPTION OF THE PREFERRED EMBODIMENT

Figures 2A, 2B, 2C, 2D:
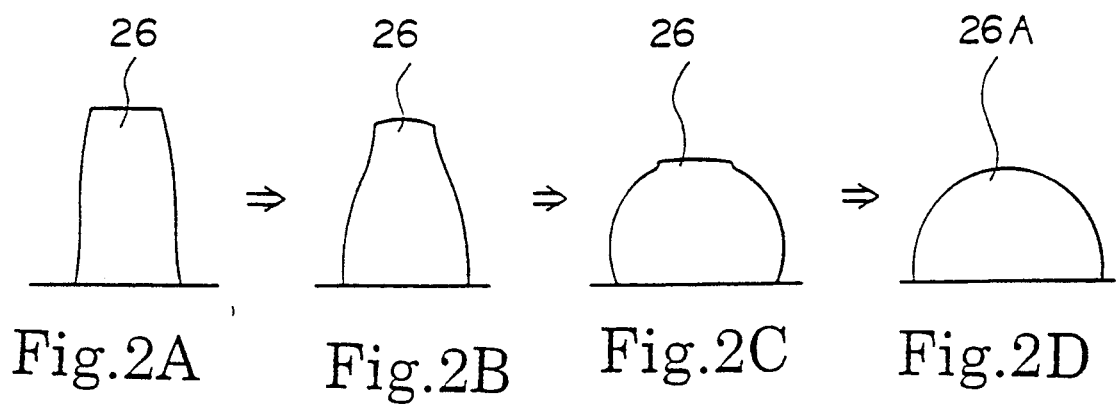
FIGS. 2A to 2D illustrate changes in the shape of a projection with the lapse of time.

An embodiment of the invention will be described hereinunder with reference to the accompanying drawings.

Referring first to FIGS. 1A to 1E, a resist master forming process will be described. FIGS. 1A to 1E illustrate, step by step, the process up to the formation of a resist master in an optical waveguide array producing method according to the invention.

First, a resist application step is carried out. In this step, a layer of photoresist 22 is formed on a flat sheet 21 of a silicon wafer or glass sheet. As the material of the photoresist 22 there is used a positive type photoresist (trade name: PMER P-G7900, a product of Tokyo Ohka Kogyo). First, the photoresist 22 is applied onto the flat sheet 21 by a spin coating method that is carried out at 1500 rpm for 20 seconds. Thereafter, the flat sheet 21, thus coated with the photoresist 22, is prebaked for 10 minutes at 90° C. As a result, a 15 μm thick layer of the photoresist 22 is formed on the flat sheet 21. Next, onto the photoresist 22 layer just formed, a further photoresist 22 is applied by spin coating again at 1500 rpm for 20 seconds. Thereafter, the flat sheet 21, double-coated with the photoresist 22 layers, is prebaked for 30 minutes again at 90° C. As a result, a 30 μm thick photoresist 22 layer is formed on the flat sheet 21 (FIG. 1A).

Next, a mask exposure step is performed in which the photoresist 22, which has been formed on the flat sheet 21 in the resist application step shown in FIG. 1A, is selectively exposed to light. First, a transparent photomask 23 is placed on the 30 μm thick photoresist 22 layer in close contact therewith. The photomask 23 has light shielding portions 27 in conformity with the desired waveguide patterns. For example, the patterns are line-and-space patterns having a 60 μm pitch in the light shielding portion (center to center of the light shielding portions) and the light exposure portions (spaces) 20 μm in width. Ultraviolet light is radiated onto the photoresist 22 from above and through the photomask 23. Consequently, the layer of the photoresist 22 is selectively exposed to the light according to the light shielding portions 27 of the optical waveguide patterns. The exposure dose of the ultraviolet light is 600 mj/cm2 (FIG. 1B).

Next, a development step is performed in which the portions of the photoresist 22 which have been radiated by the ultraviolet light, in the mask exposure step shown in FIG. 1B, are dissolved by a developer (trade name: P-5G stock solution, a product of Tokyo Ohka Kogyo). The flat sheet 21, which has gone through the mask exposure step, is immersed in the developer at 25° C. for four minutes, whereby only the portions of the photoresist 22 exposed to the ultraviolet light, indicated at 24, are selectively dissolved. Consequently, there remain, on the flat sheet 21, projections of the photoresist 22 according to patterns that are the reverse of the optical waveguide patterns of the light shielding portions 27 formed in the photomask 23 (FIG. 1C).

Then, a rinsing step is performed, in which the portions of the photoresist 22 which have been selectively dissolved, in the development step of FIG. 1C, are washed away by pure water leaving projections 26 formed on the flat sheet 21 of the photoresist 22 layer having a generally trapezoidal sectional shape (FIG. 1D). Then, as shown FIG. 1D, each projection 26 is completely separated from the other projections 26 on the flat sheet 21. That is, it is necessary that the flat sheet 21 is exposed after the rinsing step when the flat sheet 21 is viewed from the side on which projections 26 are provided. If the projections 26 are not completely separated from each other on the flat sheet 21, projections 26 can bridge after a postbaking step, described later. Occurrence of such bridging should be avoided. However, the surface roughness of the projections 26 is 1 μm or so. This is mainly because, in the mask exposure step shown in FIG. 1B, the ultraviolet light 24 radiated onto the photoresist 22 layer is scattered in the material of the photoresist 22 due to the heterogeneity of the material, for example, and so cannot travel straight through the material.

A postbaking step is then performed in which the projections 26 on the flat sheet 21, which have gone through the rinsing step shown in FIG. 1D, are heat-melted and their surfaces are smoothed thereby. More specifically, the projections 26 found on the flat sheet 21, after the rinsing step, are heated for 30 minutes at 135° C. As a result, the sectional shape of the projections 26 changes, with the lapse of time, to produce protuberances 26A having a surface roughness of 0.01 μm or less and having a generally semi-circular sectional shape, as shown in FIG. 1E and FIGS. 2A to 2D. The shape results because the material of each projection 26 is melted by the heat and a surface tension is exerted on the surface thereof. Since the surface tension acts to reduce the surface area, the surface of the melted projection 26 becomes smooth and generally semi-circular in section. The protuberances 26A and the flat sheet 21, which have gone through the postbaking step, constitute a resist master 30 (FIG. 1E).

Now, the process for forming a stamper 40, after the formation of the resist master 30, will be described with reference to FIGS. 3A to 3F.

Figure 3A:
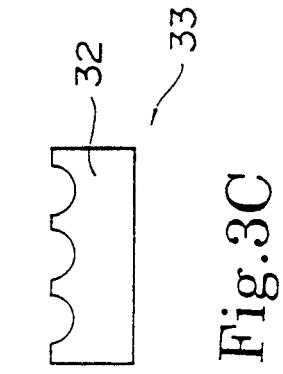
FIGS. 3A to 3F illustrate a step by step casting method of a stamper forming process.

First, an electroconductive film forming step is performed in which an electroconductive nickel, film 31 is formed on the surface of the resist master 30 having the protuberances 26A. More specifically, an electroconductive nickel film 31, about 0.1 μm in thickness, is formed by sputtering on the surface of the resist master 30 including the protuberances 26A (FIG. 3A).

Figure 3B:
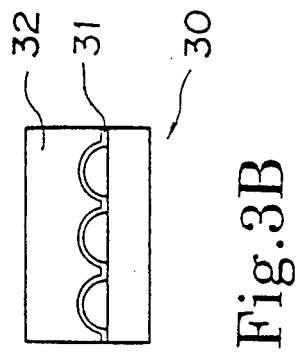

Next, a first electroforming step is performed in which a first nickel layer 32 is formed on the resist master 30 and, as formed, includes the nickel film 31. More specifically, the first nickel layer 32, about 300 μm in thickness, is formed by electroforming on the resist master 30 to incorporate the nickel film 31. Thus, as described in the following steps, the electroconductive nickel film 31 is included in the first nickel layer 32 (FIG. 3B).

Figure 3C:
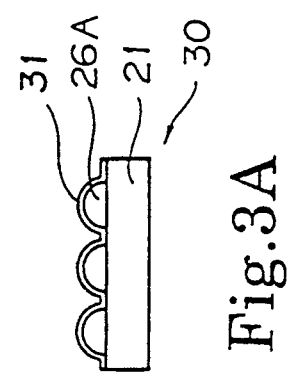

Then, a metal master forming step is performed in which there is formed a metal master 33. More specifically, first the flat sheet 21 is separated from the protuberances 26A with the first nickel layer 32, including the electroconductive nickel film 31, formed thereon. Thereafter, the first nickel layer 32 and the protuberances 26A, remaining in the grooves of the first nickel layer 32, are immersed in acetone or a strong alkali solvent, in which the protuberances 26A are removed completely by an ultrasonic washing method. As a result, the surface shape of the resist master 30 is transferred completely to the first nickel layer 32. The first nickel layer 32 is now a metal master 33 (FIG. 3C).

Figure 3D:
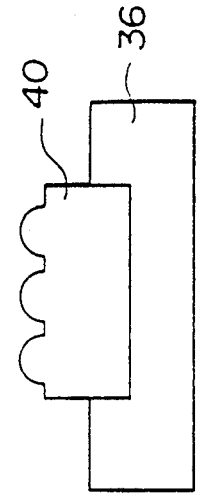

Next, a release film forming step is performed in which a release film is formed on the groove-side surface of the metal master 33. More specifically, a nickel oxide film 34 is formed by an anodic oxidation method or a method of dipping in an oxidizing solution. In this way there is formed a film, having a releasability characteristic, on the groove-side surface of the metal master 33 (FIG. 3D).

Figure 3E:
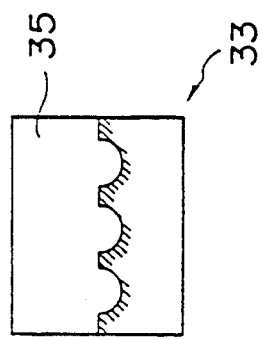

Then, a second electroforming step is conducted, in which a second nickel layer 35 is formed on the groove side of the metal master 33 having the release, film formed thereon. More specifically, the second nickel layer 35, which is about 300 μm thick, is formed by electroforming on the metal master 33 having the nickel oxide film 34 formed thereon (FIG. 3E).

Figure 3F:
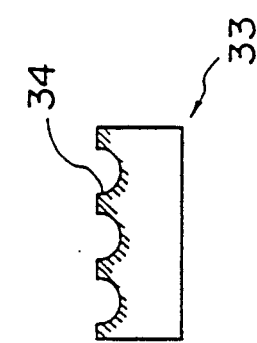
Figure 5:
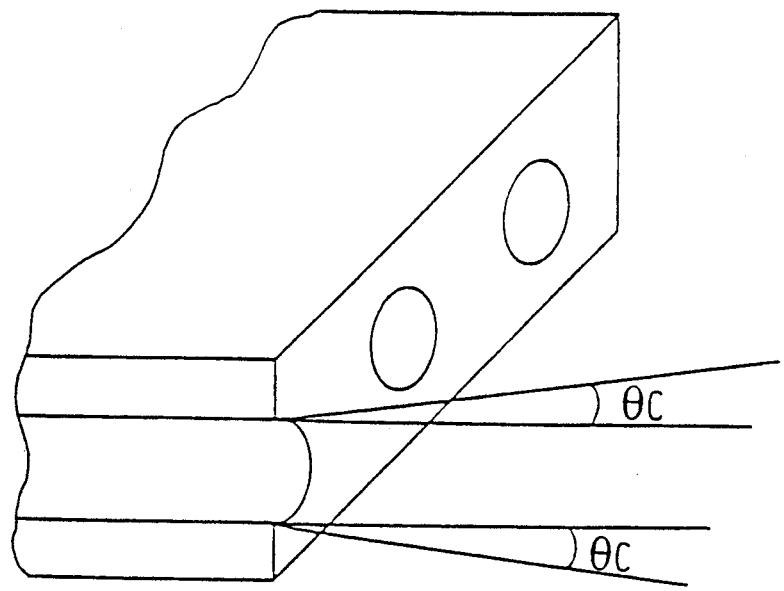
FIG. 5 is a perspective view showing a spread angle of the light emitted from an exit end of the optical waveguide array.

Lastly, a stamper forming step is conducted, in which only the metal master 33 is separated from the combination of the metal master and the second nickel layer 35. As a result, the surface shape of the metal master 33 is transferred completely, although reversed, to the second nickel layer 35 and there is obtained a stamper 40. The stamper 40 is fixed to a die 36 before use (FIG. 3F).

Through the above process the stamper 40 is formed from the resist master 30. Therefore, the groove-side surface of the stamper 40 and the groove-side surface (the protuberances 26A-side surface) of the resist master 30 are of the same shape.

Now, a step by step process for forming an optical waveguide array 50, following the formation of the stamper 40, will be described with reference to FIGS. 4A to 4E.

First, a clad base forming step is performed in which a clad base 44 is formed. More specifically, a transparent sheet 41 is positioned planarly in parallel with the protuberance side of the stamper 40 but offset by a fine gap of 200 μm or so. Next, an ultraviolet light curing resin 42, of a low refractive index, is poured into the gap and then ultraviolet light 24 is radiated onto the resin 42 from above and through the transparent sheet 41 to cure the resin 42 (FIG. 4A).

Then, by separating the stamper 40 from the resin 42 and the transparent sheet 41, there is formed a clad base 44 consisting of the transparent sheet 41 and the cured resin 42 having grooves 43 formed therein (FIG. 4B). As the ultraviolet light curing resin 42, of a low refractive index, there is used an acrylic resin (trade name: Aronix, refractive index 1.46, a product of Toa Gosei Chemical Industry Co., Ltd.) and a material which is transparent to near ultraviolet radiation is, used as the transparent sheet 41. An example is borosilicate glass which has been surface-treated by a UV-03 ashing process for enhancing the adhesion to the ultraviolet light curing resin 42. The UV-03 ashing process will not be described in detail here because it is a known process utilized widely in the formation of silicon integrated circuits. The transparent sheet 41 serves as a reinforcing member for the optical waveguide array 50.

Next, a core forming step is performed in which cores 46 are formed in the grooves 43 of the clad base 44. More specifically, an ultraviolet light curing resin 45 of a high refractive index is charged into the grooves 43 of the clad base 44 through one end of the grooves. The resin 45 is charged only into the grooves 43 by capillary action while an overflow from the grooves is prevented due to surface tension of the resin 45. After the grooves 43 are fully filled with the ultraviolet light curing resin 45 of a high refractive index, the ultraviolet light 24 is radiated from above the grooves 43. As a result, the resin 45 is cured completely to form cores 46 in the grooves 43, the cores 46 having a generally semi-circular sectional shape. If the ultraviolet light curing resins 42, 45, are difficult to cure in an oxygen atmosphere (in air), then they can be cured in an oxygen-free atmosphere, e.g. in a nitrogen atmosphere. As the resin 45 there was used an acrylic resin (trade name: Aronix M210, refractive index 1.54, a product of Toa Gosei Chemical Industry Co., Ltd.). This resin cured easily even in an oxygen atmosphere (in air), and it required about 30 minutes to fill the grooves 43 sufficiently with this resin. However, this time differs depending on conditions, e.g. the length of each groove 43. It was confirmed that the surface 46a of each core 46, after the filling with the resin 45 was within 0.01 μm in terms of surface roughness due to its surface tension (FIG. 4C).

Then, a clad layer forming step is performed in which a clad layer 47 and another transparent, sheet 41 are provided on the core 46-side surface of the clad base 44. More specifically, first a transparent sheet 41 is positioned planarly in parallel with but offset from the core 46-side surface of the clad base 44 by a fine gap of about 200 μm in the same manner as in the clad base forming step illustrated in FIGS. 4A and 4B. Next, the gap is filled with the ultraviolet light curing resin 42 of a low refractive index. Thereafter, the ultraviolet light 24 is radiated onto the resin 42 from above and through the transparent sheet 41 to cure the resin 42. The resin 42, thus cured, forms a clad layer 47 (FIG. 4D).

Lastly, there is performed a finishing step in which a final optical waveguide array 50 is formed. More specifically, the clad base 44, core 46, clad layer 47 and transparent sheet 41, which have gone through the clad layer forming step illustrated in FIG. 4D, are shaped by a suitable means, e.g. cutting, grinding or polishing, and ends 48, having a surface roughness of 0.1 μm or less, are formed in appropriate positions whereby a final optical waveguide array 50 is formed (FIG. 4E).

In the optical waveguide array 50 produced by going through the steps described above, the pitch of the cores 46 is (the distance between a center of adjacent cores) 60 μm, the width of each core 46 is 43 μm, and a sectional shape of each core 46 is generally semi-circular.

When the optical waveguide array 50 thus completed was evaluated using a He-Ne laser beam 632.8 nm in wavelength, it proved to have optical waveguides of a very good quality, each having an opening angle of 26.5° and a transmission loss of 0.1 dB/cm or less.

Further, light can be transmitted with no more transmission loss in each core 46 than in a planar structure when the structure has bends having a radius of curvature of 2 mm or more.

The invention is not limited to the embodiment described above in detail. Various modifications may be made without departing from the scope of the invention. For example, in this method, it is possible to form the clad portion by directly using the resist master 30 instead of the stamper 40. Furthermore, it is possible to form an optical waveguide array by using a flat sheet made of transparent material having low refractive index and photoresist having high refractive index. In this case, the core portion is laminated with or embedded by a transparent material having low refractive index, after the postbaking step. In the resist application step shown in FIG. 1A, a sheet-like photoresist may be adhered to the flat sheet 21 by fusion-bonding using heat, whereby the number of steps can be decreased to a considerable extent in comparison with the photoresist application by spin coating.

In the mask exposure step shown in FIG. 1B, by selecting the shape of the mask 23 freely, it is possible to obtain cores 46 that have a width of only a few μm, or to branch or cross them.

By using a resin superior in releasability, such as TPX, as the transparent sheet 41 in FIG. 4 and separating the transparent sheet 41 from the optical waveguide array 50, it is possible to impart flexibility to the waveguide array 50. In FIG. 4, moreover, as the material of the ultraviolet light curing resin 45 of a high refractive index and that of the ultraviolet light curing resin 42 of a low refractive index, there may be used other materials. Examples are a fluorine resin (trade name: Defensa 479-18, refractive index 1.53, a product of Dainippon Ink And Chemicals, Incorporated), which is an ultraviolet light curing resin of a high refractive index, and a fluorine resin (trade name: Defensa 7710, refractive index 1.40, a product of the same company as above), which is an ultraviolet light curing resin of a low refractive index. By so changing the materials it is possible to change the opening angle and the transmission efficiency of the resulting optical waveguide array 50.

The optical waveguides can be produced also by curing a light-transmitting resin other than, the photocurable resin described in the foregoing embodiment.

In the clad base forming step shown in FIG. 4A, an injection molding method may be adopted in place of the casting method described in the foregoing embodiment, whereby the productivity of the optical waveguide array 50 is improved.

In the core forming step shown in FIG. 4C, the grooves 43 may be filled with resin by spin coating in place of utilizing capillary action described in the embodiment.

It is possible to apply the optical waveguide array 50 of the present invention to not only light transmission paths but also to photo distributors, photo couplers, and other optical circuits or integrated circuits.

Further, the optical waveguide array 50 may take not only a flat sheet-like structure, but also may be a three-dimensional structure that is formed by bending or overlapping.

A method for producing an optical waveguide array having optical waveguides of a very good quality has been made clear by the above detailed description. The following description is now provided for a method for producing a microlens array of a very good quality which uses the above method.

Heretofore, as a microlens array used as an integrated optical system, there has been known a microlens array comprising very small spherical lenses or convex lenses arranged on a straight line or a microlens array comprising refractive index distribution type lenses, such as selfoc lenses, arranged in a zigzag form. In a microlens array, however, since it is necessary to arrange lenses in parallel while positioning them accurately, the production of the array is troublesome and the unit cost of each constituent member is high. In view of this point, the following description is for a microlens array capable of being easily and inexpensively produced and a method for producing the same.

First, a resist master forming process will be described step by step with reference to FIGS. 6A to 6E, which illustrate a resist master forming process using a photolithographic technique in the microlens array producing method according to the invention.

Figure 6A:
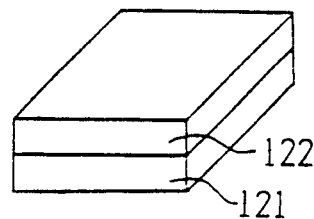
FIGS. 6A to 6E illustrate a step by step photolithography process to form a resist master in a microlens array forming method.

First, a resist application step is performed, in which a layer of a photoresist 122 is formed on a flat sheet 121 which is a silicon wafer or a glass sheet. Used as the material of the photoresist 122 is a positive type thick photoresist film (trade name: PMER P-G7900, a product of Tokyo Ohka Kogyo). In this step, the photoresist 122 is applied onto the flat sheet 121 by a spin coating method, the spin coating being carried out at 1500 rpm for 20 seconds. Thereafter, the flat sheet 121, thus coated with the photoresist 122, is prebaked for 10 minutes at 90° C. As a result, a 15 μm thick layer of the photoresist 122 is formed on the flat sheet 121. Next, onto the photoresist 122 layer just formed, additional photoresist 122 is applied by spin coating. Again, the spin coating is done at 1500 rpm for 20 seconds. Thereafter, the flat sheet 121, double-coated with the photoresist 122 layers is prebaked for 30 minutes again at 90° C. As a result, a 30 μm thick photoresist 122 layer is formed on the flat sheet 121 (FIG. 6A). This step is the same as the foregoing resist application step shown in FIG. 1A.

Figure 6B:
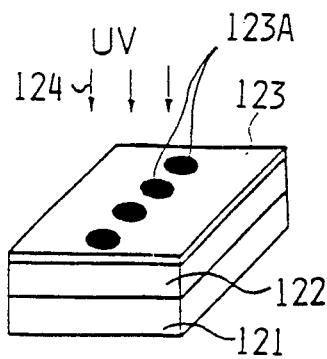

Next, a mask exposure step is performed, in which the photoresist 122, which has been formed on the flat sheet 121 in the resist application step shown in FIG. 6A, is selectively exposed to light. First, a transparent photomask 123 is placed on and in close contact with the 30 μm thick photoresist 122 layer. The photomask 123 is a light-transmitting thin sheet, having on the surface thereof circular light shielding portions 123A, each having a 50 μm diameter and arranged in a straight line at a pitch of 85 μm. Ultraviolet light 124 is radiated onto the photoresist 122 from above and through the photomask 123. Thus, the layer of the photoresist 122 is exposed to the ultraviolet light selectively at the portion thereof other than under the patterns of the circular light shielding portions 123A. The exposure dose of the ultraviolet light is 600 mj/cm2 (FIG. 6B).

Next, a development step is performed in which the portion of the photoresist 122 exposed to the ultraviolet light is dissolved by a developer (trade name: P-5G stock solution, a product of Tokyo Ohka Kogyo). The flat sheet 121 which has gone through the mask exposure step is immersed in the developer at 25° C. for 4 minutes, whereby only the portion of the photoresist 122 exposed to the ultraviolet light is selectively dissolved. As a result, generally columnar protrusions of the photoresist 122 are formed on the flat sheet 121 (FIG. 6C).

Figure 6C:
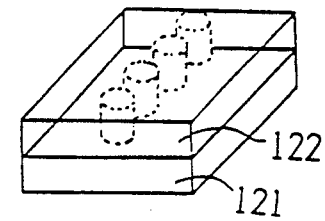

Subsequently, a rinsing step is performed in which the portion of the photoresist 122 which has been selectively dissolved, in the development step of FIG. 6C, is washed away by pure water leaving protrusions 126 of the photoresist 122 having a generally columnar shape on the flat sheet 121. Then, each protrusion 126 is completely separated from the other protrusions 126 on the flat sheet 121. That is, it is necessary that the flat sheet 121 is exposed after the rinsing step when the flat sheet 121 is viewed from the side on which protrusions 126 are provided. If the protrusions 126 are not completely separated from each other on the flat sheet 121, protrusions 126 can bridge after a postbaking step, described later. Occurrence of such bridging should be avoided. However, the surface roughness of the protrusions 126 is 1 μm or so. This is mainly because in the mask exposure step shown in FIG. 6B, the ultraviolet light 124 radiated onto the photoresist 122 layer is scattered in the material of the photoresist 122 due to the heterogeneity of the material and so does not travel straight ahead through the material (FIG. 6D).

Figure 6D:
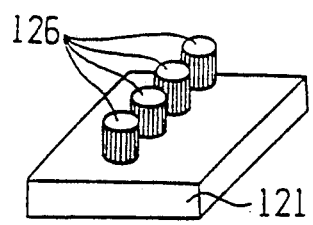
Figure 6E:
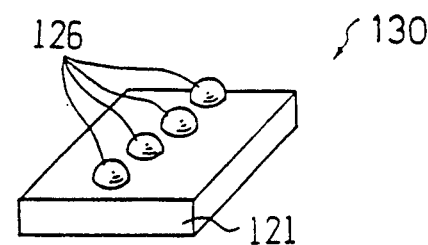
Figure 9A:
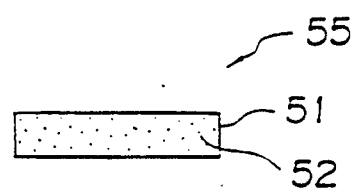
FIGS. 9A to 9D illustrate the step by step process of a selective polymerization method which is one of the related art step by step optical waveguide array forming methods.
Figure 9B:
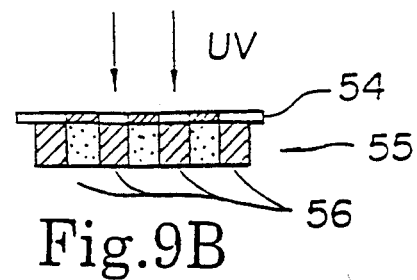
Figure 9C:
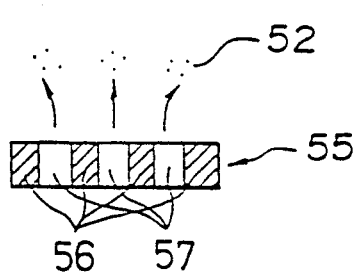
Figure 9D:
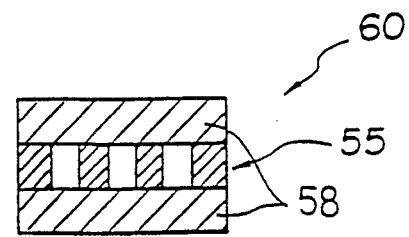

Lastly, a postbaking step is performed in which the protrusions 126 left on the flat sheet 121 after the rinsing step, shown in FIG. 6D, are heat-melted and their surfaces are smoothed by the melting. More specifically, the protrusions 126, on the flat sheet 121, are heated for 30 minutes at 135° C. As a result the protrusions 126 become generally semi-spherical protuberances 126 having a surface roughness of 0.01 μm or less. This is because the material of each protrusion 126 is melted by heat and a surface tension is exerted on the surface thereof. Since the surface tension acts to reduce the surface area, the surface of the melted protrusion 126 becomes smooth and generally semi-spherical in shape. The protuberances 126 and the flat sheet 121, after the postbaking step, constitute a resist master 130 (FIG. 6E).

Now, the process for forming a stamper 140, after the formation of the resist master 130, will be described with reference to FIGS. 7A to 7C.

First, an electroconductive film forming step is performed in which an electroconductive nickel film 131 is formed on the surface of the resist master 130 including the protuberances 126. More specifically, the electroconductive nickel film 131, about 0.1 μm in thickness, is formed by sputtering on the surface of the resist master 130 having the protuberances 126 (FIG. 7A).

Next, an electroforming step is performed in which a nickel layer 132 is formed on the resist master 130 with the overlying electroconductive nickel film 131. More specifically, the nickel layer 132, about 300 μm in thickness, is formed by electroforming on the resist master 130 (FIG. 7B). In the following steps, the electroconductive nickel film 131 is included into the nickel layer 132.

A stamper forming step forms a stamper 140. In this step, the flat sheet 121 is separated from the protuberances 126 with the nickel layer 132 formed between and thereon. Thereafter, the protuberances 126, remaining inset into the nickel layer 132, are immersed in acetone or a strong alkali solvent and the protuberances 126 are removed completely by an ultrasonic washing method. As a result, a reverse image of the resist master 130 is formed in the nickel layer 132. A combination of a mold 133 and this nickel layer 132, fixed thereto, is designated a stamper which is used as a die. The stamper 140 has a large number of semi-spherical recesses and the surface roughness of those portions is equal to that of the resist master 130, i.e., 0.01 μm or less (FIG. 7C).

Now, a process for forming a microlens array 150, after the formation of the stamper 140, will be described with reference to FIGS. 8A and 8B.

First, a transparent sheet 141 having a thickness of about 0.3 mm is positioned planarly in parallel with but offset from the surface side having grooves of the stamper 140 by a fine gap of about 200 μm. This gap is filled with an ultraviolet light curing resin 142. As the ultraviolet light curing resin 142 there was used a colorless, transparent acrylic resin. It is necessary that a casting step be carried out in a nitrogen atmosphere because of an anaerobic property of the ultraviolet light curing resin 142. An example of the transparent sheet 141 is a resin sheet such as borosilicate glass or polycarbonate, which has been subjected to an UV-03 ashing treatment for enhancing the adhesion. Next, ultraviolet light (UV) is radiated from above and through the transparent sheet 141 to completely cure the ultraviolet light curing resin 142 (FIG. 8A).

Then, the stamper 140 is separated from both the transparent sheet 141 and the resin 142 to obtain a microlens array 150 having many semi-spherical convex portions 143 (FIG. 8B).

In the microlens array produced by the above process, the surface roughness of each semi-spherical convex portion 143 is 0.01 μm or less and thus the convex surfaces are very smooth, permitting light to be refracted ideally without being scattered therein. The convex portions 143 also serve as convex lenses because they have a semi-spherical shape. Moreover, as the position of each convex portion 143 is determined directly by the shape of the mask, it is not necessary to individually arrange and accurately position very small lenses as necessary in the prior art. Further, a gap from the light emitting end of a waveguide to the microlens array is established accurately by adjusting the thickness of the transparent sheet 141. Additionally, the radius of curvature of each generally semi-spherical convex portion 143 can be controlled by adjusting the diameter of each circular light shielding portion of the mask 123, the coating thickness of the photoresist 122, and the heating temperature and time in the postbaking step. For example, when the microlens array was produced under the foregoing conditions, the radius of curvature of the surface of each convex portion 143 was 25 μm.

The present invention is not limited to the above embodiment. Modifications may be made as necessary. For example, the material of the ultraviolet light curing resin 142 is not limited to the one described above. A suitable material may be selected freely, for example from among acryl-urethane resins and fluorine resins. The microlens array described above may be formed by an injection molding method using the stamper 140 as a die. Further, the shape of the projecting portions formed by a photolithographic technique is not always limited to a generally columnar shape, they may be in a generally square shape. In such a case, the projecting portions can be made approximately semi-spherical by increasing the heating temperature or time in the postbaking step.

What is claimed is:

1. A method for manufacturing a microlens array, comprising the steps of:
   forming an intermediate material of photoresist on a flat sheet, the intermediate material comprising at least one projection formed in the shape of a predetermined pattern;
   forming a resist master by heating the intermediate material to a temperature whereby the surfaces of the at least one projection are smoothed under the influence of surface tension;
   forming a stamper having an inverted surface shape of said resist master; and
   forming a microlens array using said stamper and a light-transmitting material.

2. The method according to claim 1, wherein said light-transmitting material is an ultraviolet light curing resin.

3. The method according to claim 2, wherein said process for forming the intermediate material comprises the steps of:
   forming a photoresist layer on said flat sheet;
   exposing the photoresist layer to ultraviolet light from above a photomask placed on the photoresist layer, said photomask having a light shielding portion in conformity with a microlens pattern;
   dissolving the photoresist which has been radiated by the ultraviolet light by a developer; and
   washing away the photoresist which has been dissolved to form at least one projection of the photoresist layer in conformity with the microlens pattern on said flat sheet.

4. The method according to claim 3, wherein said process for forming the resist master comprises the steps of:
   heat-melting the projection of the photoresist layer in conformity with the microlens pattern on said flat sheet and smoothing the surface of the projection.

5. The method according to claim 4, wherein said process for forming the stamper comprises the steps of:
   forming an electroconductive nickel film on the surface of said resist master having the projection;
   forming a nickel layer on said resist master incorporating the nickel film;
   separating said flat sheet from said resist master with said first nickel layer formed thereon;

removing the projection remaining in a recess in said nickel layer.

6. The method according to claim 5, wherein said process for forming the microlens array comprises the steps of:
positioning a transparent sheet in parallel with but offset from the projection side of said stamper by a fine gap;
pouring the ultraviolet light curing resin into the gap;
radiating a ultraviolet light onto the ultraviolet light curing resin from above said transparent sheet; and
separating said stamper from both said transparent sheet and the ultraviolet light curing resin.

7. The method according to claim 1, wherein said process for forming said microlens array is performed in an oxygen-free atmosphere.

8. The method according to claim 1, wherein a plurality of projections are formed and each projection is completely separated from the other of the projections.

9. The method according to claim 1, wherein the section of the intermediate material changes from substantially rectangular shape to substantially semicircular shape by heating the intermediate material.

* * * * *